(12) United States Patent
Zhang et al.

(10) Patent No.: US 7,666,020 B2
(45) Date of Patent: Feb. 23, 2010

(54) LAND GRID ARRAY SOCKET WITH IMPROVED FASTENING STRUCTURE

(75) Inventors: Jie-Feng Zhang, ShenZhen (CN); Wen He, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/215,216

(22) Filed: Jun. 25, 2008

(65) Prior Publication Data

US 2008/0318459 A1    Dec. 25, 2008

(30) Foreign Application Priority Data

Jun. 25, 2007    (TW) .............................. 96210280 U

(51) Int. Cl.
*H01R 13/62* (2006.01)

(52) U.S. Cl. ...................................... 439/331

(58) Field of Classification Search ................ 439/331, 439/330, 73
See application file for complete search history.

(56) References Cited

U.S. PATENT DOCUMENTS

| | | | | |
|---|---|---|---|---|
| 4,515,425 A | * | 5/1985 | Nakano ........................ 439/73 |
| 4,621,884 A | * | 11/1986 | Berkebile et al. ........... 439/367 |
| 5,234,349 A | * | 8/1993 | Matsuoka et al. ............. 439/70 |
| 5,244,404 A | * | 9/1993 | Kishi et al. .................. 439/331 |
| 5,562,473 A | * | 10/1996 | Ikeya et al. .................. 439/331 |
| 6,908,327 B2 | * | 6/2005 | Ma .............................. 439/331 |
| 6,948,947 B2 | * | 9/2005 | Lee et al. ....................... 439/73 |
| 7,182,619 B2 | * | 2/2007 | Hsu ............................. 439/331 |
| 7,207,822 B2 | * | 4/2007 | Szu ............................. 439/342 |
| 7,438,580 B1 | * | 10/2008 | Aoki et al. ................... 439/331 |
| 2005/0287858 A1 | * | 12/2005 | Toda et al. ................... 439/331 |
| 2006/0116016 A1 | * | 6/2006 | Szu ............................. 439/331 |
| 2006/0148298 A1 | * | 7/2006 | Nakao et al. ................. 439/331 |
| 2006/0166542 A1 | * | 7/2006 | Hsu ............................. 439/331 |
| 2007/0054532 A1 | * | 3/2007 | Ho .............................. 439/331 |
| 2007/0259553 A1 | * | 11/2007 | Mar ............................. 439/331 |

* cited by examiner

*Primary Examiner*—T C Patel
*Assistant Examiner*—Vladimir Imas
(74) *Attorney, Agent, or Firm*—Andrew C. Cheng; Wei Te Chung; Ming Chieh Chang

(57) ABSTRACT

A fastening structure comprises a stiffener including a first end and a second end opposite to the first end. A load plate is pivotally supported on a first end of the stiffener and has a pair of lateral walls. A lever is pivotally mounted on the lateral walls of the load plate and a locking portion to lock the load plate to the stiffener. An LGA socket using the fastening structure comprises an insulative housing having a plurality of contacts. A stiffener includes a first end and a second end and is positioned on a bottom surface of the insulative housing. A load plate is pivotally attached on the first end of the stiffener and has at least a lateral sidewall. A lever is pivotally mounted on the lateral sidewall, the lever and the load plate is being pivotal between an open position and a closed position together, the lever has a transverse locking portion to lock the load plate to the stiffener near the second end of the stiffener.

13 Claims, 5 Drawing Sheets

LAND GRID ARRAY SOCKET WITH IMPROVED FASTENING STRUCTURE

BACKGROUND OF THE INVENTION

1. Field of the Invention

The present invention relates to an electrical connectors, and more particularly to an land grid array (LGA) socket for electrically connecting two electrical interfaces, such as an LGA package and a printed circuit board (PCB).

2. Description of the Prior Art

An LGA socket is used to electrically connect an LGA package and a printed circuit board. Referring to FIG. 1 to FIG. 2, an LGA socket typically comprises an insulative housing 10, a plurality of contacts 11 received in the insulative housing 10, a stiffener 12 positioned on a bottom surface of the insulative housing 10, a load plate 13 mounted on a first end of the stiffener 12 to partially cover the insulative housing 10 and a lever 14 mounted on the second end of a stiffener 12 to lock the load plate 13 to the stiffener 12. The lever 14 comprises an actuating portion 141 and a retaining portion 142 perpendicular to the actuating portion 141. A pair of openings 121, which are spaced apart from each other, are formed in the second end of the stiffener 12 for supporting the retaining portion 142 of the lever 14. A latch portion 122 is formed on one side of the stiffener 12 for locking the actuating portion 141 in a closed position. A middle of the retaining portion 142 has a locking section 1420 to press a bearing tongue 131 of the load plate 13 in order to lock the load plate 13 to the stiffener 12.

However, as well known that the printed circuit board has many electrical elements, thus, during the process of the lever 13 and the load plate 14 opening to two sides of the LGA socket, there will generate interference with other electrical elements disposed on the printed circuit board.

To prevent deformation of the lever and the load plate of the LGA socket and the interference with other electrical elements, U.S. Pat. No. 7,207,822 issued to Szu on Apr. 24, 2007 discloses another type of LGA socket, in which the lever is attached to the load plate by a tongue extending from the load plate to form a hook. This type of LGA socket may be convenient to assemble the LGA socket and mount an LGA package thereon. However, the lever mounted on the load plate is not secure. Therefore, improvement may be needed.

SUMMARY OF THE INVENTION

One particular aspect of the present invention is to provide a fastening structure and a land grid array (LGA) socket using the fastening structure. The LGA socket using the fastening structure is used to electrically connect an LGA package to a printed circuit board.

In order to achieve the object set forth, a fastening structure comprises a stiffener including a first end and a second end opposite to the first end. A load plate is pivotally supported on a first end of the stiffener and has a pair of lateral walls. A lever is pivotally mounted on the lateral walls of the load plate and a locking portion to lock the load plate to the stiffener. An LGA socket using the fastening structure comprises an insulative housing having a plurality of contacts. A stiffener includes a first end and a second end and is positioned on a bottom surface of the insulative housing. A load plate is pivotally attached to the first end of the stiffener and has at least a lateral sidewall. A lever is pivotally mounted on the lateral sidewall, the lever and the load plate is being pivotal between an open position and a closed position together, the lever has a transverse locking portion to lock the load plate to the stiffener near the second end of the stiffener.

For further understanding of the invention, reference is made to the following detailed description illustrating the embodiments and examples of the invention. The description is only for illustrating the invention and is not intended to be considered limiting of the scope of the claim.

DESCRIPTION OF PREFERRED EMBODIMENT OF THE INVENTION

Reference will now be made to the drawings to describe the present invention in detail.

Figure 1:
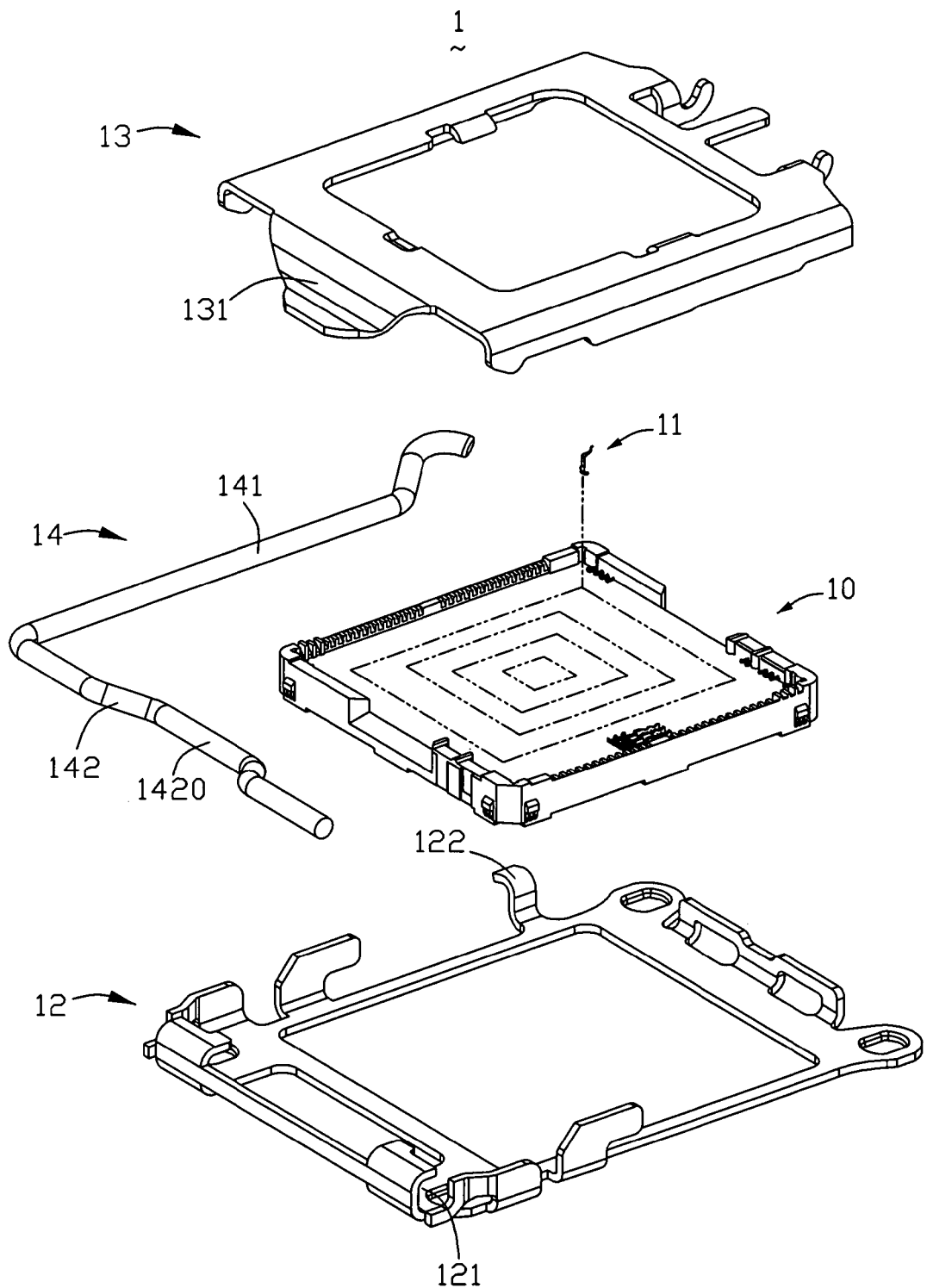
FIG. 1 is an exploded view of a conventional LGA socket.
Figure 2:
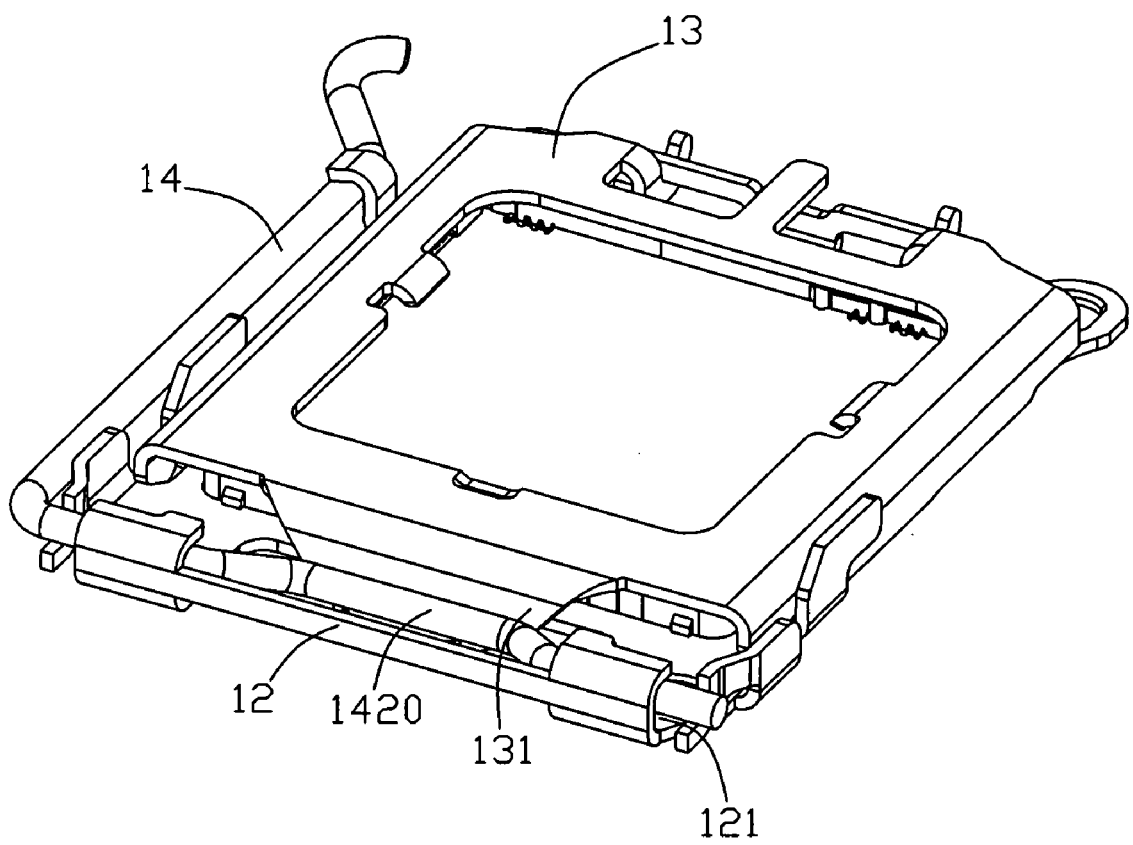
FIG. 2 is an assembled view of FIG. 1.
Figure 3:
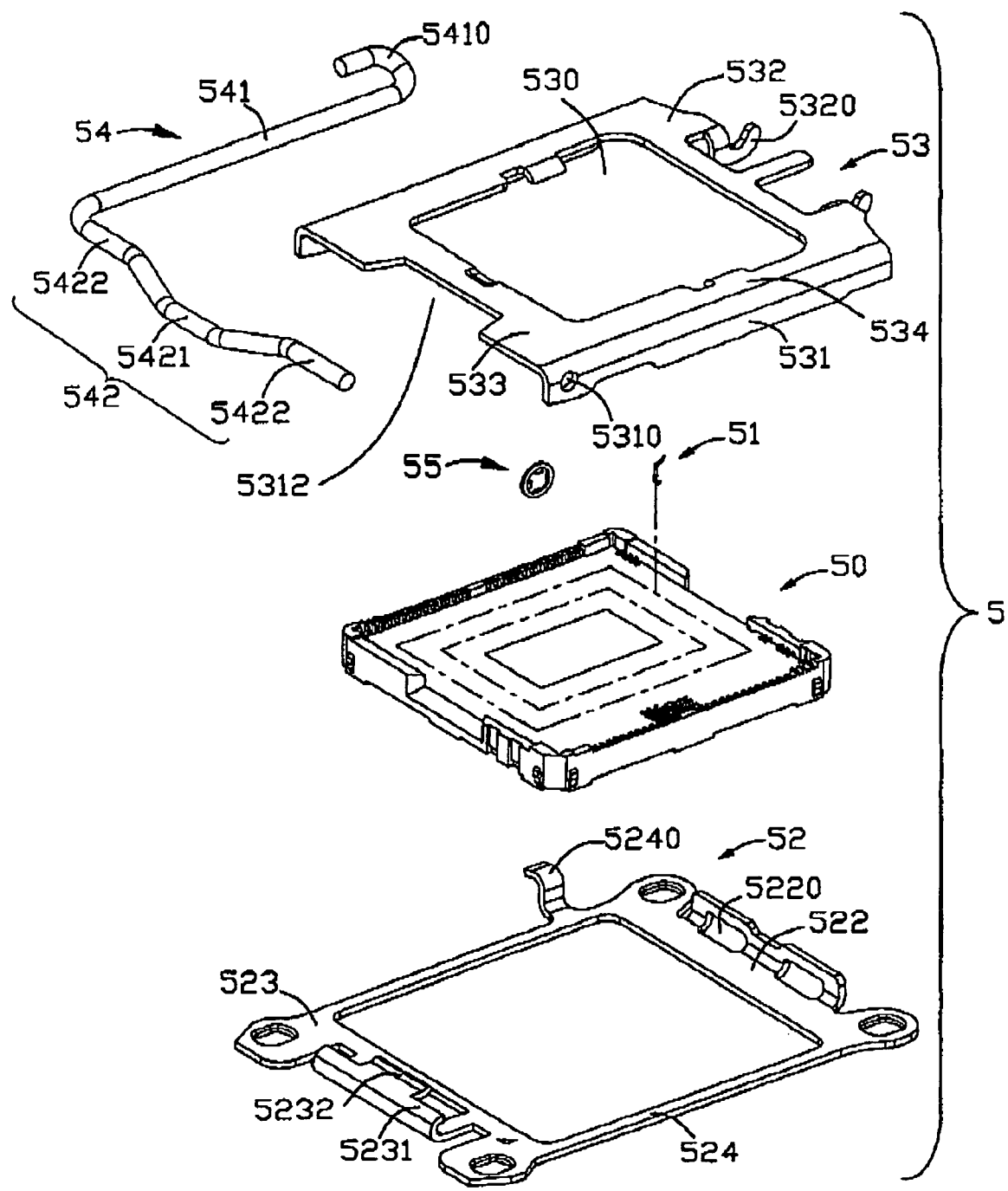
FIG. 3 is an exploded view of an LGA socket in accordance with a preferred embodiment of the present invention.
Figure 4:
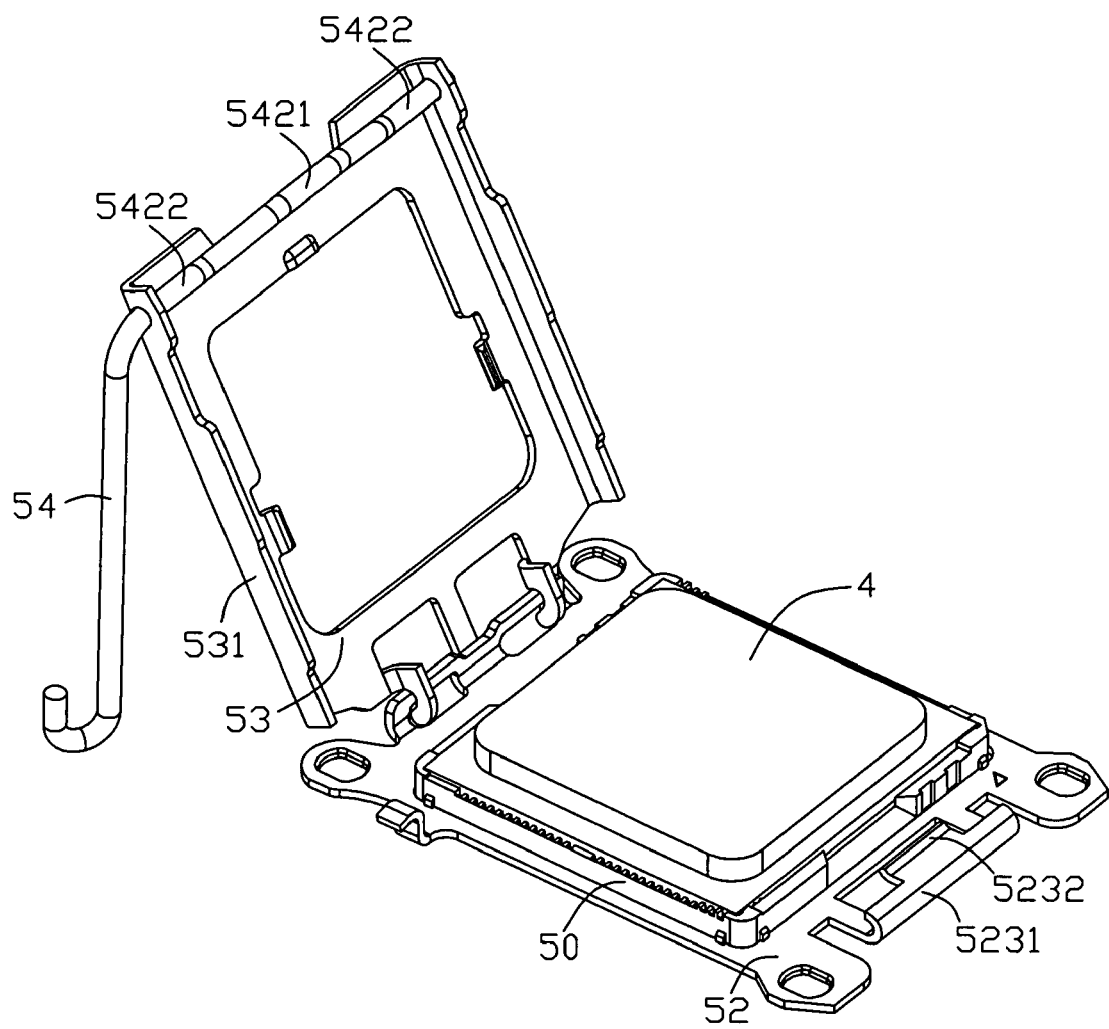
FIG. 4 is an assembled view of the LGA socket of FIG. 3, wherein a load plate with a lever attached thereto is oriented to an opening position.

Referring to FIG. 3 to FIG. 4, an LGA (Land Grid Array) socket 5 in accordance with a preferred embodiment of the present invention is used to electrically connect an LGA package 4 and a printed circuit board (not shown). The LGA socket 5 comprises an insulative housing 50 having a plurality of contacts 51 received therein and a stiffener 52 disposed around the housing 50. A load plate 53 is pivotally attached to the stiffener 52 and rotatable relative to the stiffener 52 between an opening position and a closed position. A lever 54 is pivotally mounted on the load plate 53 for pressing and successively locking the load plate 53 in the close position.

Individual elements of the LGA socket 5 will now be described in greater details. Referring to FIG. 3, the insulative housing 50 is molded from resin or the like and is shaped in form of a rectangular planar board. The housing 50 has an electric region defining a plurality of passages thereof to receive the plurality of contacts 51 therein. The LGA package 4 and the printed circuit board form an electrical connection therebetween via the contacts 51 received in the LGA socket 5.

The stiffener 52 is a rectangular metal frame located along with an periphery of the housing 50. The stiffener 52 has a first end 522 for attaching the load plate 53, a second end 523 opposite to the first end 522 and a pair of sidewalls 524 respectively and integrally connecting the first end 522 and the second end 523. The first end 522 defines a pair of latching slots 5220 spaced apart from each other. The second end 523 forms a shaft support piece. The shaft support piece includes a curved portion 5231 bent upwardly from the stiffener 52 and a curved tongue 5232 bowing inward from the curved portion 5231 for holding the lever 54. A latch portion 5240 is integrally formed on one of the sidewalls 524 near the first end 522. The bottom of the stiffener 52 defines four holes (not numbered) at the corners thereof to secure the LGA socket 5 on the printed circuit board. In alternative embodiments, the stiffener 52 can be two separate parts, served as a first end 522 and a second end 523. That is to say, the stiffener 52 can be broken or omitted.

The load plate 53 is shaped in form of a rectangular planar board 534 and has an opening 530 in a middle area thereof. The load plate 53 comprises a connecting side 532 to be connected to the first end 522 of the stiffener 52, a press side 533 corresponding to the second end 523 of the stiffener 52, and a pair of lateral sidewalls 531 vertically bent from the load plate 53 for jointing the connecting side 532 to the press side 533. The connecting side 532 forms a pair of curved latches 5320 pivotally inserted into the latching slots 5220 of the stiffener 52. The load plate 53 has a pair of holes 5310 on the lateral sidewalls 531 near the press side 533 for pivotally receiving the lever 54. The load plate 53 forms a pair of downwardly curved press sections (not labeled) on the opposite sides of the opening 530 of the load plate 53 for pressing the LGA package 4 evenly. On the press side 533 of the load plate 53, there is a slot 5312 at the middle of a free end adapted to conveniently assemble the lever 54 to the load plate 53.

The lever 54 is bent from a metal bar. The lever 54 is L-shaped and comprises an actuating portion 541 with a curved actuating arm 5410 and a retaining portion 542 that is perpendicular to the actuating portion 541. The retaining portion 542 has a transverse locking portion 5421 that is positioned in the middle of the retaining portion 542 and is offset outside from the axis of the retaining portions 542 with a pair of inclined sections (not labeled) connecting the transverse locking portion 5421 and a pair of rotary portions 5422 of the retaining portion 542. The retaining portion 542 is arranged in the holes 5310 of the load plate 53 and secured on the tail end by a clasp 55.

In assembly, the retaining portion 542 of the lever 54 is pivotally received in the holes 5310 of the load plate 53. The stiffener 52 is assembled to the housing 50 before or after the load plate 53 mounted on the stiffener 52.

Referring to FIG. 4, the load plate 53 with the lever 54 is attached in an opening position. Actuation of the lever 54 moves the load plate 53 and the lever 54 between an opened position and a closed position together.

Figure 5:
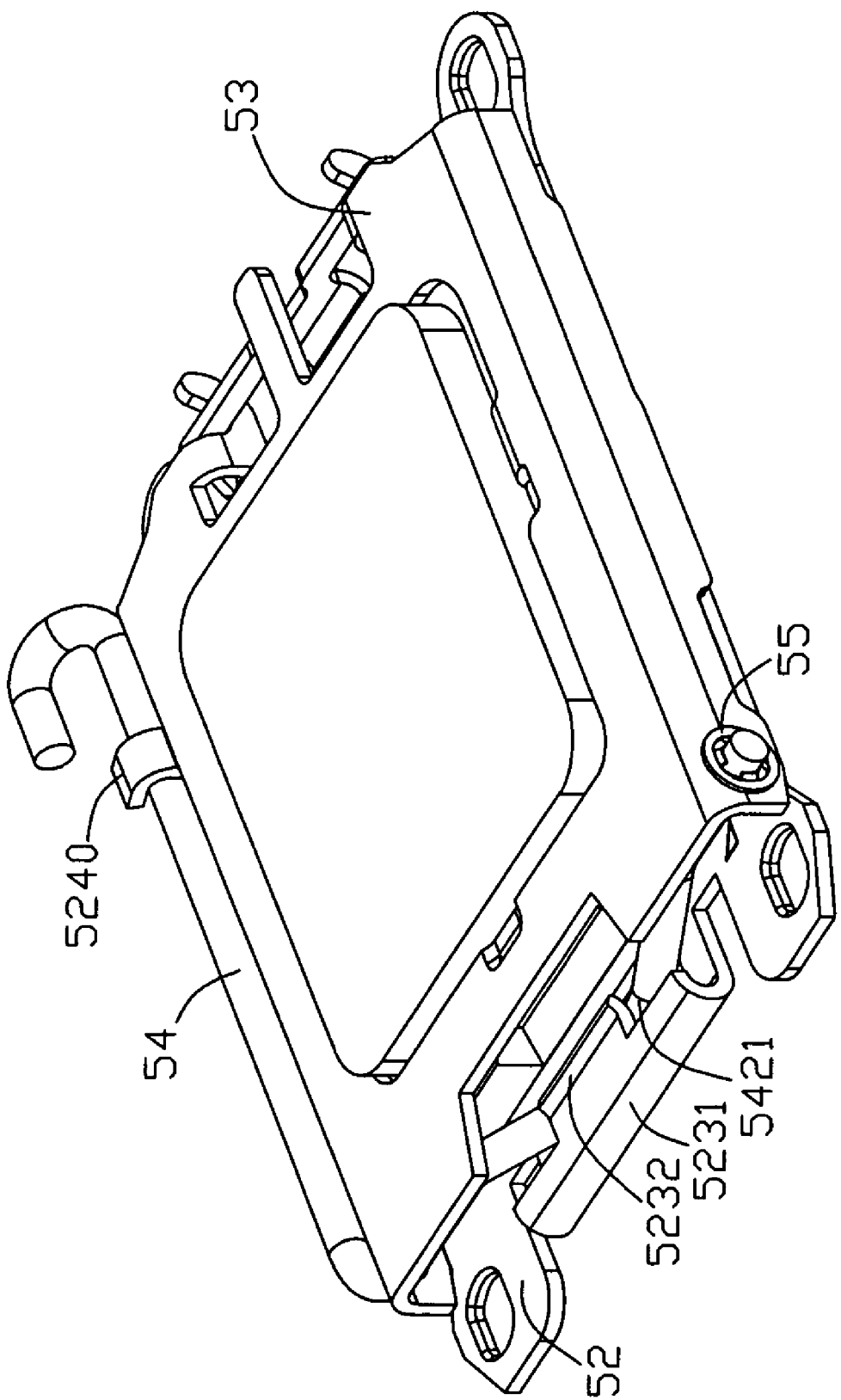
FIG. 5 is an assembled view of the LGA socket of FIG. 3, wherein the load plate with the lever attached thereto is oriented to an closed position.

Referring to FIG. 5, it discloses the LGA package 4 is mounted in the housing 50 and the LGA socket 5 is in the closed position. The transverse locking portion 5421 of the lever 54 is locked by the tongue 5232 of the stiffener 52. The actuating portion 541 is latched by the latch portion 5240.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A fastening structure comprising:
   a stiffener including a first end and a second end opposite to the first end;
   a load plate pivotally supported on the first end of the stiffener, the load plate having a pair of lateral sidewalls; and
   a lever pivotally mounted on the lateral sidewalls of the load plate, the lever including an actuating portion and a retaining portion connected to the actuating portion, the retaining portion including a pair of rotary portions and a transverse locking portion positioned between the rotary portions, the transverse locking portion having an offset outside with an axis of the retaining portion to lock the load plate to the stiffener;
   wherein the lever is a metal haulm, the retaining portion and the transverse locking portion are perpendicular to the actuating portion, respectively.

2. The fastening structure as claimed in claim 1, wherein the lateral sidewalls extend from the load plate between the first end and the second end of the stiffener in a vertical direction.

3. The fastening structure as claimed in claim 1, wherein a pair of latching slots extend upwardly from the first end of the stiffener and is used to receive the load plate.

4. The fastening structure as claimed in claim 1, wherein a shaft support piece extend upwardly and bend toward the transverse locking portion from the middle of the second end of the stiffener to engage with the locking portion of the lever.

5. The fastening structure as claimed in claim 1, wherein each of the lateral sidewalls of the load plate has a hole to pivotally receiving the rotary portion of the lever.

6. A land grid array (LGA) socket comprising:
   an insulative housing having a plurality of contacts;
   a stiffener and including a first end and a second end, the stiffener defining a central opening to receive the insulative housing;
   a load plate pivotally attached on the first end of the stiffener, the load plate having at least a lateral sidewall; and
   a lever pivotally mounted on the lateral sidewall, the lever and the load plate being pivotal between an open position and a closed position together, the lever having a transverse locking portion to lock the load plate to the stiffener near the second end of the stiffener, wherein
   the second end of the stiffener has a shaft support piece for locking the transverse locking portion of the lever; wherein
   the shaft support piece further includes a curved portion bent upwardly from the stiffener and a tongue bowing toward the first end of the stiffener from the curved portion; and
   wherein the lever is a metal haulm and includes an actuating portion and a retaining portion perpendicular to the actuating portion.

7. The LGA socket as claimed in claim 6, wherein the load plate has a slot in middle of the free end.

8. The LGA socket as claimed in claim 7, wherein the lateral sidewalls of the load plate extending between the first end and the second end of the stiffener.

9. The LGA socket as claimed in claim 8, wherein each of the lateral sidewalls of the load plate has a hole for arranging the lever.

10. The LGA socket as claimed in claim 9, wherein a pair of holes formed on the free end of a pair of lateral sidewalls.

11. The LGA socket as claimed in claim 6, wherein the transverse locking portion is located a middle of the retaining portion and protrudes toward the shaft support piece with respect to an axis of the retaining portion to engage with the shaft support piece.

12. The LGA socket as claimed in claim 11, wherein the retaining portion is arranged on the lateral sidewalls.

13. An LGA socket comprising:
   a metallic stiffener defining a central opening therein and a lengthwise direction thereof, the metallic stiffener having two lateral side walls in a transverse direction;
   an insulative housing received in said central opening and defining an upward recess in an upper face thereof;
   a plurality of contacts disposed in the housing;
   a load plate defining opposite first and second end regions in said lengthwise direction, of which the first end region is pivotally attached to a first end of the stiffener; and
   a lever pivotally attached to the second end region of the load plate and having a pair of rotary portions extending axially in said transverse direction parallel to said lateral side walls and perpendicular to said lengthwise direction, and defining two opposite ends respective engaged with two opposite vertical walls of the load plate which are spaced from each other in said transverse direction, and a locking section between said pair of rotary portions in said transverse direction and being offset from said rotary portions in both said transverse direction and the lengthwise direction; wherein a second end of said stiffener, which is opposite to said first end, is formed with a lying U-shaped configuration and essentially aligned with the locking section in said lengthwise direction so as to engage said locking section; and wherein the lying U-shaped configuration includes an upper tongue defining two side areas and a middle area therebetween in said transverse direction under a condition that the middle area has a greater width along the lengthwise direction than said two side areas so as to comply with the configurations of said locking section and the pair of rotary portions of said lever.

* * * * *